(12) United States Patent  
Perisetty

(10) Patent No.: US 7,675,317 B2
(45) Date of Patent: Mar. 9, 2010

(54) INTEGRATED CIRCUITS WITH ADJUSTABLE BODY BIAS AND POWER SUPPLY CIRCUITRY

(75) Inventor: Srinivas Perisetty, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/900,973

(22) Filed: Sep. 14, 2007

(65) Prior Publication Data

US 2009/0072857 A1    Mar. 19, 2009

(51) Int. Cl.
*H03K 19/173* (2006.01)
(52) U.S. Cl. ............... 326/38; 326/41; 327/534; 327/537; 713/320
(58) Field of Classification Search ............ 326/31, 326/33–34, 37–41, 47; 327/534–535, 537, 327/544; 713/320–321, 200, 600, 340
See application file for complete search history.

(56) References Cited

U.S. PATENT DOCUMENTS

| | | | |
|---|---|---|---|
| 6,343,044 B1 | 1/2002 | Hsu et al. | |
| 6,429,726 B1 * | 8/2002 | Bruneau et al. | ............. 327/537 |
| 6,744,301 B1 | 6/2004 | Tschanz et al. | |
| 6,858,897 B2 | 2/2005 | Chen | |
| 6,900,666 B2 | 5/2005 | Kursun et al. | |
| 6,970,034 B1 | 11/2005 | Harris | |
| 6,975,535 B2 * | 12/2005 | Kim et al. | ............. 365/185.09 |
| 7,015,741 B2 | 3/2006 | Tschanz et al. | |
| 7,089,515 B2 | 8/2006 | Hanafi et al. | |
| 7,089,527 B2 | 8/2006 | Hart et al. | |
| 7,119,604 B2 | 10/2006 | Chih | |
| 7,129,745 B2 * | 10/2006 | Lewis et al. | .................. 326/38 |
| 7,134,031 B2 | 11/2006 | Flautner | |
| 7,142,009 B1 * | 11/2006 | Watt et al. | .................... 326/38 |
| 7,164,307 B2 * | 1/2007 | Tschanz et al. | ............. 327/534 |
| 7,176,745 B2 * | 2/2007 | Itoh et al. | ................... 327/534 |

(Continued)

OTHER PUBLICATIONS

U.S. Appl. No. 11/901,019, filed Sep. 14, 2007, Perisetty.
U.S. Appl. No. 11/394,033, filed Mar. 29, 2006, Rahim et al.
Dastidar et al., U.S. Appl. No. 11/478,148, filed Jun. 28, 2006.

*Primary Examiner*—Vibol Tan
*Assistant Examiner*—Christopher Lo
(74) *Attorney, Agent, or Firm*—Treyz Law Group; G. Victor Treyz; David C. Kellogg

(57) ABSTRACT

An integrated circuit is provided with adjustable transistor body bias circuitry and adjustable power supply circuitry. The adjustable circuitry may be used to selectively apply body bias voltages and power supply voltages to blocks of programmable logic, memory blocks, and other circuit blocks on the integrated circuit. The body bias voltages and power supply voltages may be identified by computer aided design tools. The body bias voltages may be used to reduce leakage currents and power consumption when high speed circuit block operation is not required. Reduced power supply voltages may also be used to reduce power consumption when high speed circuit block operation is not required. To ensure optimum switching speeds, circuit blocks for which high-speed performance is critical can be provided with minimal body bias voltage or no body bias and can be provided with maximum power supply levels.

18 Claims, 15 Drawing Sheets

U.S. PATENT DOCUMENTS

| | | |
|---|---|---|
| 7,220,636 B2 | 5/2007 | King |
| 7,265,605 B1 * | 9/2007 | Vasudevan .................. 327/534 |
| 7,348,827 B2 * | 3/2008 | Rahim et al. ................. 327/534 |
| 2005/0225376 A1 * | 10/2005 | Kin Law ..................... 327/534 |

* cited by examiner

| IN | GATE P | $V_{SUPINT}$ |
|---|---|---|
| 0 | $V_{CCHG}$ ($\geq V_{CCL}$) | 0 |
| $V_1$ | BETWEEN 0 AND $V_{CCHG}$ | $V_1$ |
| $V_{CCL}$ | 0 | $V_{CCL}$ |

FIG. 14

INTEGRATED CIRCUITS WITH ADJUSTABLE BODY BIAS AND POWER SUPPLY CIRCUITRY

BACKGROUND

This invention relates to integrated circuits, and more particularly, to circuitry and design systems for integrated circuits that can be used to improve performance and reduce power consumption by making transistor power supply and body bias adjustments.

There is an ongoing effort in the semiconductor industry to improve device performance. Improvements in speed, power consumption, and density have been achieved by scaling down transistor components to smaller sizes and lower operating voltages. Part of these scaling efforts have resulted in reduced values of transistor threshold voltage. Low transistor threshold voltages are generally advantageous, because they help to improve transistor switching speed. However, low transistor threshold voltages may also lead to increased transistor leakage currents. Elevated levels of transistor leakage are undesirable, because transistor leakage can produce undesired power losses.

To ensure that transistor leakage currents do not become excessive as threshold voltages are scaled to lower values, some integrated circuits are operated with reduced power supply voltages. For example, the positive power supply voltage that is used to power an integrated circuit's core logic may be reduced from 1.5 volts to 1.2 volts in an attempt to compensate for the leakage current increases that are produced from threshold voltage reductions. Although reductions in power supply voltages can be helpful in reducing power consumption, power supply voltages cannot be reduced too much without adversely affecting transistor switching speeds.

To address these issues, some integrated circuit designs use body biasing arrangements in which the bulk or body terminals of certain transistors in the circuit are biased to increase the transistors' threshold voltage. Transistors with body terminals that are biased in this way exhibit reduced leakage. Power can also be conserved by placing portions of a circuit that are not being used into a sleep state by removing their positive power supply voltage.

Although techniques such as these help to reduce power consumption while preserving device performance, it is not always possible to bias the body terminal of transistors in active circuits, because body bias arrangements reduce transistor speed. Moreover, transistors that form part of an active circuit cannot be placed in a sleep state, because the circuit will not function in its sleep state.

It would therefore be desirable to be able to provide improved ways in which to address transistor performance and power consumption challenges for integrated circuits.

SUMMARY

Integrated circuits are provided with adjustable body bias circuitry and adjustable positive power supply circuits. The adjustable circuitry may be used to supply different body bias voltages to different blocks of circuitry on an integrated circuit. For example, circuit blocks that must switch relatively rapidly may be provided with a ground body bias voltage, whereas circuit blocks that need not switch as rapidly may be provided with a nonzero body bias voltage. The adjustable circuitry may also be used to supply different positive power supply voltages to the different circuit blocks. For example, circuit blocks that contain transistors that must switch rapidly may be provided with a maximum power supply voltage, whereas circuit blocks with less stringent timing requirements may be provided with a reduced power supply voltage.

Body bias voltages and positive power supply voltages may be selected as needed to meet design requirements while minimizing leakage currents. By minimizing leakage currents, power consumption on an integrated circuit can be reduced.

The integrated circuits on which the adjustable power supply circuitry is provided may be programmable integrated circuits that contain programmable elements. The programmable elements may be loaded with configuration data. Static control signals that are generated using the programmable elements may be applied to the adjustable power supply circuitry to establish desired levels of body bias voltage and positive power supply voltage.

The adjustable power supply circuitry may be based on any suitable programmable circuitry. If desired, independently adjustable positive power supplies may be provided that each include an individually programmable voltage divider. The output from the individually programmable voltage divider in each adjustable positive power supply may be applied to an input of an operational amplifier that is arranged in a unity gain configuration. The setting of the programmable voltage divider may be adjusted by loading appropriate configuration data into associated programmable elements. A programmable voltage divider of this type may be used to control the operation of a programmable voltage regulator for the adjustable body bias circuitry.

Computer aided design tools may be provided that accept a user's custom logic design and that produce corresponding configuration data for implementing the custom logic design in a programmable logic device. When implementing the custom logic design, some circuit blocks on the programmable logic device are used and some circuit blocks on the programmable logic device are unused. Among the used circuit blocks, some blocks have more stringent timing requirements and other blocks have less stringent timing requirements.

The computer aided design tools may process the user's design to identify unused circuit blocks. The computer aided design tools may also identify which of the used blocks must switch rapidly and which of the used blocks are permitted to switch more slowly. Based on this information, the computer aided design tools can generate configuration data that adjusts the adjustable power supply circuitry so as to meet timing constraints and other design constraints while minimizing leakage currents and power consumption. For example, the positive power supply and body bias voltages that are applied to the unused blocks can be set to a ground voltage to turn those blocks off.

Among the used blocks, the faster-switching blocks can be provided with ground body bias voltages, whereas the slower-switching blocks can be provided with nonzero body bias voltages (e.g., negative body bias voltages for n-channel metal-oxide-semiconductor transistors). The nonzero body bias voltages increase the threshold voltages of the transistors to which they are applied and thereby reduce leakage currents.

The level of positive power supply voltage that is applied to each used circuit block can also be varied. For example, blocks which need to switch rapidly may be supplied with a maximum positive power supply voltage (e.g., 1.1 volts), whereas blocks that have slower switching speed requirements can be powered using a lower positive power supply voltage (e.g., 1.0 volts).

Further features of the invention, its nature and various advantages will be more apparent from the accompanying drawings and the following detailed description of the preferred embodiments.

BRIEF DESCRIPTION OF THE DRAWINGS

FIG. 14 is a table showing illustrative voltages associated with nodes in the programmable voltage supply circuit of FIG. 11 in accordance with an embodiment of the present invention.

DETAILED DESCRIPTION

The present invention relates to optimizing integrated circuits by making adjustments to power supply voltages. The integrated circuits may be any suitable type of integrated circuit, such as microprocessors, application-specific integrated circuits, digital signal processors, memory circuits, etc. If desired, the integrated circuits may be programmable integrated circuits that contain programmable circuitry. The programmable circuitry can be configured by adjusting the settings of memory elements. With one suitable arrangement, which is sometimes described herein as an example, the integrated circuits that are being optimized are programmable integrated circuits such as programmable logic device integrated circuits.

Programmable logic devices are integrated circuits that can be configured by a user to perform custom logic functions. A programmable logic device is configured ("programmed") by loading configuration data into the device. The configuration data selectively turns on and off components of the device's circuitry and thereby customizes the logic on the device. Programmable logic devices with non-volatile configuration memory retain their configuration data when power is removed. Programmable logic devices with volatile configuration data are typically loaded with configuration data on system power-up using an ancillary circuit called a configuration device. The configuration device may store the configuration data using non-volatile memory. Programmable logic devices with non-volatile memory can also be configured after installation in a system (so-called in-system programming).

Programmable logic device integrated circuits have core logic that is powered using a core logic power supply voltage. There is generally a positive core logic power supply voltage and a ground voltage associated with the power supply for the core logic. The positive power supply voltage, which may be referred to as Vccl, may have a nominal maximum value of 1.1 volts (as an example). The ground power supply voltage, which is sometimes referred to as Vss, may be 0 volts (as an example). Some circuitry on the integrated circuit may operate at one or more higher positive power supply voltages such as an elevated power supply voltage Vcchg of 1.6 volts (as an example). A body bias voltage Vb may be applied to the body terminals of transistors on the integrated circuit. The body bias voltage that is applied to n-channel metal-oxide-semiconductor (NMOS) transistors is generally negative. If desired, a positive body bias may be applied to p-channel metal-oxide-semiconductor transistors. The body bias voltages help to reduce leakage current and thereby minimize power consumption.

Figure 1:
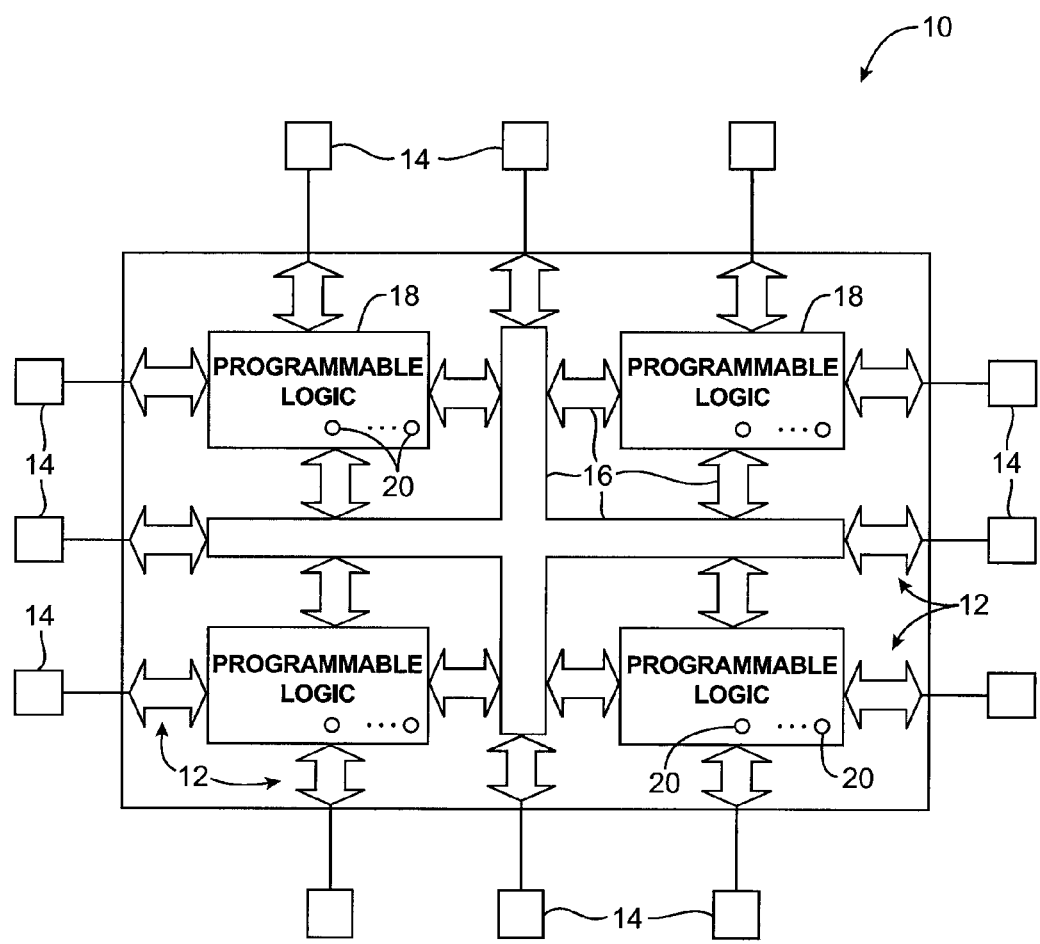
FIG. 1 is a diagram of an illustrative programmable integrated circuit such as a programmable logic device in accordance with an embodiment of the present invention.

An illustrative programmable logic device 10 is shown in FIG. 1. Programmable logic device 10 may have input-output circuitry 12 for driving signals off of device 10 and for receiving signals from other devices via input-output pins 14. Input-output circuitry 12 contains input buffers and output buffers (sometimes referred to as input drivers and output drivers). Pins 14 may be any suitable types of pins or solder bumps for making electrical connections between the internal circuitry of device 10 and external packaging. Some of the pins 14 are used for high-speed communications signals. Other pins are used to provide power supply voltages to the device 10. Pins 14 may also be used for DC and low-frequency signals.

Interconnection resources 16 such as global and local vertical and horizontal conductive lines and busses may be used to route signals on device 10. The remainder of the circuitry 18 on device 10 includes blocks of programmable logic, memory blocks, regions of digital signal processing circuitry, processors, hardwired circuits for supporting complex communications and arithmetic functions, etc. The programmable logic in circuitry 18 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers.

Some of the logic of programmable logic device 10 is fixed (hardwired). The programmable logic in device 10 includes components that may be configured so that device 10 performs a desired custom logic function. The programmable logic in programmable logic device 10 may be based on any suitable programmable technology. With one suitable approach, configuration data (also called programming data) may be loaded into programmable elements 20 in the programmable logic device 10 using pins 14 and input/output circuitry 12. During normal operation of device 10, the programmable elements 20, which are sometimes referred to as configuration bits or configuration memory, each provide a static control output signal that controls the state of an associated logic component in the programmable logic of circuitry 18.

In a typical volatile arrangement, the programmable elements 20 may be random-access memory (RAM) cells that are loaded from an external configuration device integrated circuit via certain pins 14 and appropriate portions of input/output circuitry 12. The loaded RAM cells provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 10. Circuit elements in input/output circuitry 12 and interconnection resources 16 are also generally configured by the RAM cell outputs as part of the programming process (e.g., to customize I/O and routing functions). The circuit elements that are configured in input/output circuitry 12, interconnection resources 16, and circuitry 18 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from electrically-configured fuses or electrically-configured antifuses, programmable logic devices in which elements 20 are formed from electrically-programmable read-only-memory (EPROM) or erasable-electrically-programmable read-only-memory (EEPROM) technology, programmable logic devices with programmable elements made from magnetic storage elements, programmable logic devices with programmable elements made from phase-change materials, mask-programmed devices, etc.

The configuration memory of device 10 is preferably provided with configuration data from a user (e.g., a logic designer). Once provided with appropriate configuration data, the configuration memory will selectively control (e.g., turn on and off) portions of the circuitry in the programmable logic device 10 and thereby customize its functions so that it will operate as desired.

The circuitry of device 10 may be organized using any suitable architecture. As an example, the logic of programmable logic device 10 may be organized in a series of rows and columns of larger programmable logic regions or areas (sometimes referred to as logic array blocks or LABs) each of which contains multiple smaller logic regions or areas (e.g., areas of logic based on look-up tables or macrocells which are sometimes referred to as logic elements or LEs). These logic resources may be interconnected by interconnection resources 16 such as associated vertical and horizontal interconnection conductors. Interconnection conductors may include global conductive lines that span substantially all of device 10, fractional lines such as half-lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more hierarchical levels or layers in which multiple large areas are interconnected to form still larger portions of logic. Still other device arrangements may use logic that is not arranged in rows and columns. Portions of device 10 (e.g., in input/output circuitry 12 and elsewhere) may be hardwired for efficiency.

In addition to blocks of logic circuitry (e.g., the logic array blocks on device 10), device 10 may contain memory blocks (sometimes referred to as embedded array blocks or EABs). Memory blocks may be used by the logic of device 10 to store data and perform computations. Device 10 may also be organized so that other types of circuitry is provided in blocks (e.g., digital signal processing blocks, etc.). The circuit blocks on device 10 need not all have the same size. Logic blocks, memory blocks, and processing blocks may each be provided in a different size if desired.

Figure 2:
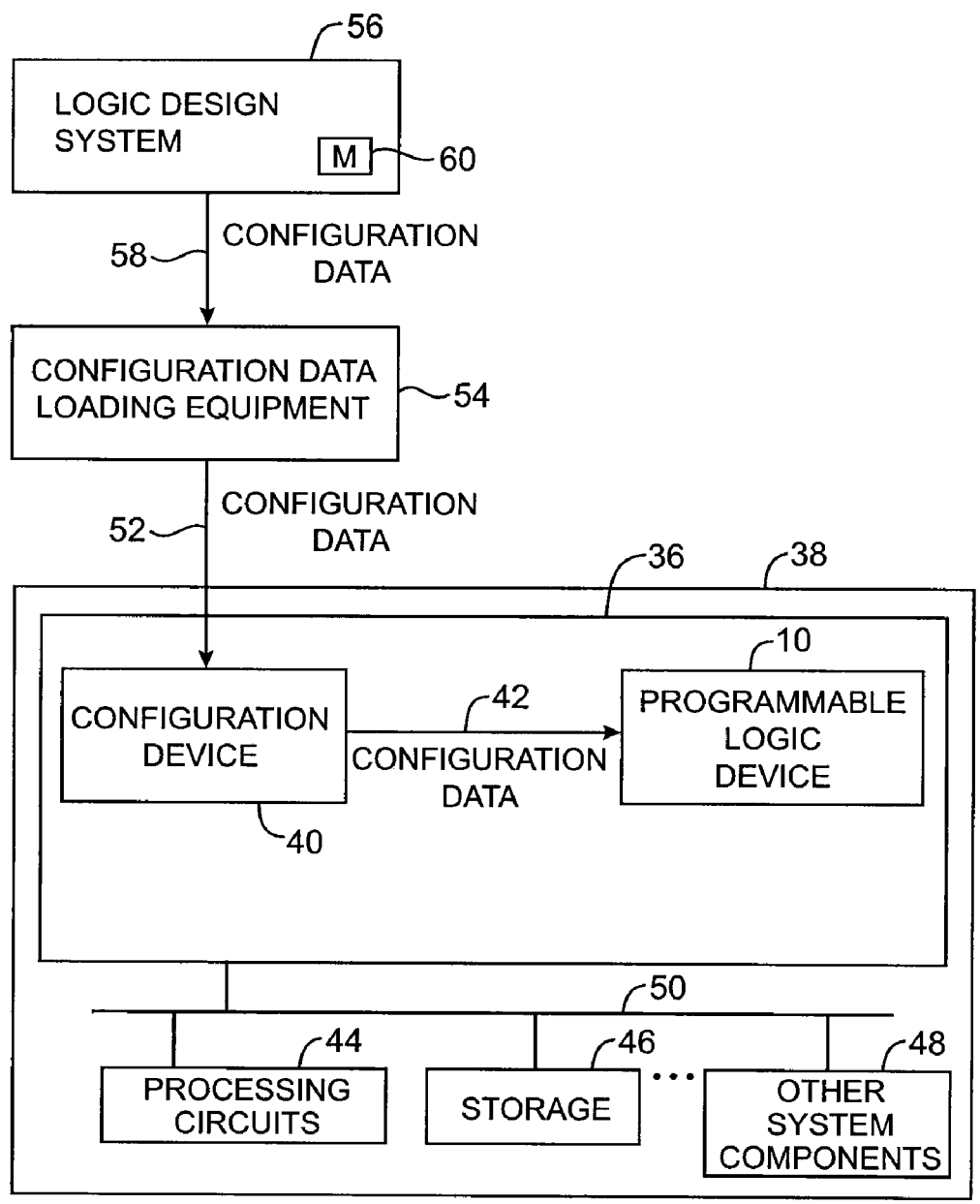
FIG. 2 is a diagram showing how programmable integrated circuit configuration data may be created by a logic design system and loaded into a programmable integrated circuit such as a programmable logic device integrated circuit to configure the device for operation in a system in accordance with an embodiment of the present invention.

An illustrative system environment in which a custom logic circuit may be designed and implemented using a programmable logic device is shown in FIG. 2. As shown in FIG. 2, a programmable logic device 10 may be mounted on a board 36 in a system 38. In general, programmable logic device 10 may receive programming data from any suitable equipment or device. In the example of FIG. 2, programmable logic device 10 is the type of programmable logic device that receives configuration data from a configuration device 40. With this type of arrangement, configuration device 40 is mounted on the same board 36 as programmable logic device 10. The configuration device 40 may, for example, include erasable-programmable read-only memory (EPROM) circuitry for storing configuration data and programmable logic device configuration data loading circuitry for loading the data into device 10. When system 38 boots up (or at another suitable time), the configuration data for configuring the programmable logic device may be supplied to programmable logic device 10 from configuration device 40, as shown schematically by path 42. The configuration data that is supplied to the programmable logic device may be stored in the programmable logic device in programmable elements 20.

System 38 may include processing circuits 44, storage 46, and other system components 48. The components of system 38 may be located on one or more boards such as board 36 or other suitable mounting structures or housings and may be interconnected by busses and other electrical paths 50.

Device 40 may be supplied with the configuration data for device 10 over a path such as path 52. Device 40 may, for example, receive the configuration data from configuration data loading equipment 54 or other suitable equipment. Data loading may take place before or after circuitry 40 is installed in system 38.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device or for producing a custom mask for a mask-programmed chip.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42.

In arrangements of the type shown in FIG. 2, the programmable logic device 10 may have configuration data cells formed from memory cells such as static random-access memory cells. This is merely one illustrative arrangement for programming a programmable logic device 10. Any suitable arrangement for programming programmable logic device 10 may be used if desired. For example, programmable logic device 10 may be based on non-volatile configuration data cells such as erasable-programmable read-only memory (EPROM) cells. With this type of arrangement, device 10 can be configured by programming the configuration data into the EPROM cells on the device. Programmable logic device 10 may also be based on programmable elements such as fuses and antifuses or programmable elements based on other technologies (e.g., magnetic devices, mask programming, etc.). In a mask-programmed environment, the configuration data (or other such data) that is produced by the logic design system may be used to generate a mask set for programming device 10. For clarity, the present invention will generally be described in the context of programmable logic devices that are configured by the loading of configuration data produced by logic design system 56, rather than mask programming.

Logic circuit design system 56 includes processing circuitry and storage 60. In supporting design operations involved in implementing a desired custom logic function, the logic design system 56 uses software implemented using circuitry and storage 60 to power supply assignments including body bias voltages and positive power supply levels that minimize leakage currents and power consumption.

Figure 3:
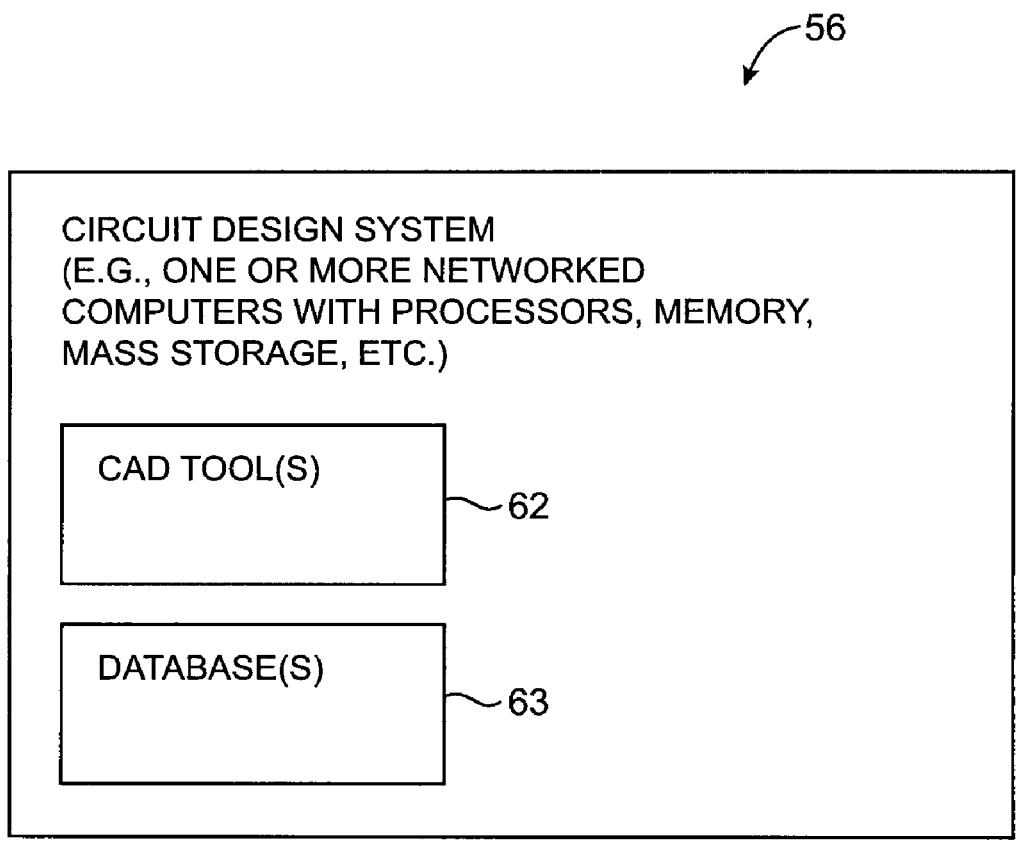
FIG. 3 is a diagram of a circuit design system that may be used to generate configuration data for implementing custom circuit designs in programmable integrated circuits such as programmable logic device integrated circuits in accordance with an embodiment of the present invention.

An illustrative circuit design system 56 in accordance with the present invention is shown in FIG. 3. System 56 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 62 and databases 63 reside on system 56. During operation, executable software such as computer aided design tools 62 runs on the processor(s) of system 56. Databases 63 are used to store data for the operation of system 56. In general, software and data may be stored on any computer-readable medium (storage) in system 56. Such storage, which is shown schematically as storage 60 of FIG. 2, may include, computer memory chips, removable and fixed media such as hard disk drives, flash memory, compact discs (CDs), DVDs, other optical media, and floppy diskettes, tapes, or any other suitable memory or storage device(s). When the software of system 56 is installed, the storage 60 of system 56 has instructions and data that cause the computing equipment in system 56 to execute various methods (processes). When performing these processes, the computing equipment is configured to implement the functions of the circuit design system.

The computer aided design (CAD) tools 62, some or all of which are sometimes referred to collectively as a CAD tool, may be provided by a single vendor or multiple vendors. Tools 62 may be provided as one or more suites of tools (e.g., a compiler suite for performing tasks associated with implementing a circuit design in a programmable logic device) and/or as one or more separate software components (tools). Database(s) 63 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

When a logic designer uses tools 62 to implement a circuit, the logic designer is faced with a number of potentially challenging design decisions. The designer must balance factors such as cost, size, and performance to create a workable end product. Tradeoffs are involved. For example, a circuit of a given design can be implemented so that it operates quickly, but consumes a large amount of power and on-chip resources or can be implemented so that is operates more slowly, while consuming less power and fewer resources.

To optimize device performance, device 10 may be provided with one or more adjustable voltage regulators. The settings of the adjustable voltage regulators may be used to adjust the positive power supply voltage that is applied to the circuitry of device 10 and/or the body bias voltage that is applied to the circuitry of device 10. The settings for the adjustable voltage supplies may be adjusted by control signals that are supplied from memory elements 20 that have been loaded with appropriate configuration data. Tools 62 may be used to analyze a user's logic design and, based on this analysis, tools 62 may automatically produce configuration data for adjusting the adjustable voltage supplies to appropriate levels.

A user may input a desired logic design using tools 62. The design may be implemented using one or more blocks of circuitry on device 10. The circuit blocks may be blocks of programmable logic (e.g., logic array blocks), memory blocks, processor blocks, or any other suitable types of circuit blocks. During the design implementation process, tools 62 may make adjustments to the positive power supply voltage and body bias voltage being used by the circuit blocks. For example, some blocks may be provided with larger power supply voltages and some blocks may be provided with lower power supply voltages, some blocks may have different body bias voltages than others, etc.

When a user inputs a desired logic design, tools 62 are provided with user-selected timing constraints and other design constraints. Tools 62 may also be provided with default constraints and may derive certain constraints from other constraints. The constraints may specify, for example, that a particular portion of the user's logic design should operate with a certain minimum speed.

During optimization, tools 62 make power supply adjustments and/or body bias adjustments that minimize power consumption while meeting design constraints. The adjustments may be made on a block-by-block basis or using any other suitable level of granularity. For example, tools 62 may identify blocks of logic that are not needed to implement the user's circuit design. Because these blocks are not being used, tools 62 can generate configuration data that powers down these blocks. In particular, tools 62 can use the adjustable voltage supply circuitry on device 10 to ensure that the positive power supply voltage level in the unused blocks and the body bias voltage for the unused blocks is set to a power-down body bias voltage of 0 volts. Tools 62 may also place unused blocks that have a non-zero positive power supply voltage Vsupint in a low-leakage-current powered-down state by using the adjustable voltage supply circuitry on device 10 to ensure that the body bias voltage in the unused blocks has a power-down voltage level that reverse biases the transistors in the blocks.

Tools 62 may identify certain circuit blocks that require maximum performance. For example, tools 62 may identify blocks that have critical speed requirements. In these blocks, the body bias voltage may be set to zero and the power supply voltage may be set to its maximum allowed value (as an example). Tools 62 may produce configuration data that represents these settings. During device programming, the configuration data may be loaded into device 10 to configure the programmable voltage supply circuitry on device 10 accordingly.

With this type of arrangement, unused circuit blocks are turned off and critical blocks are fully powered for maximum performance. If desired, other circuit blocks may be powered with other positive power supply voltages (e.g., the maximum power supply voltage or a reduced power supply voltage) and other body bias voltages (e.g., a body bias voltage of 0 volts or a nonzero magnitude above 0 volts that reduces leakage currents). Because of their potentially lower positive power supply voltages and potentially nonzero body bias voltages, the circuitry in these blocks will not switch as fast as the fully powered circuitry with grounded body terminals in the critical circuit blocks. For example, logic gates in these blocks will exhibit gate delays that are longer than those in the critical circuit blocks. Although the circuitry of these blocks will not switch as fast as the circuitry in the speed-critical blocks, the reduced positive power supply voltages and/or reduced magnitude of body bias voltage may help to reduce leakage current and therefore minimize power consumption.

Figure 4:
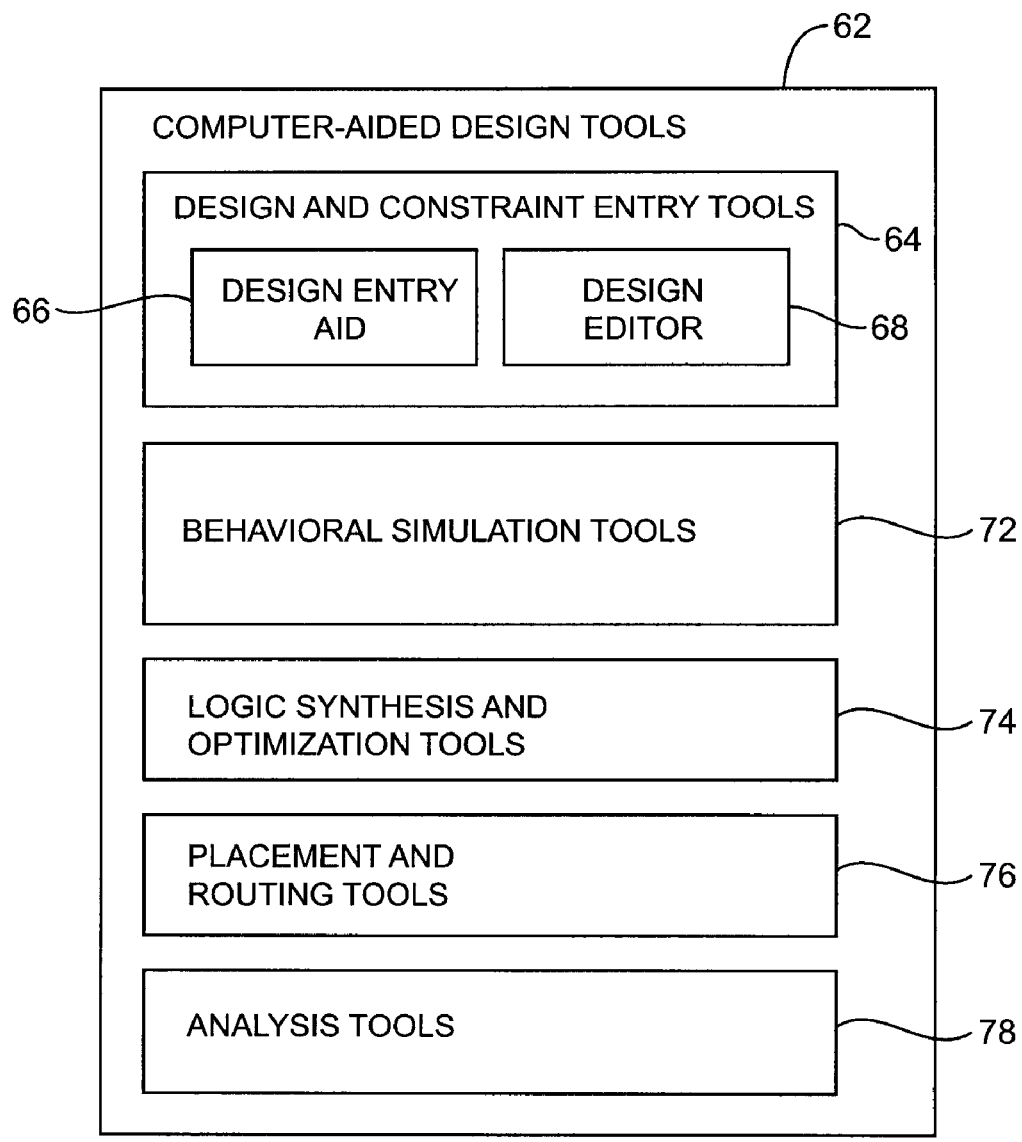
FIG. 4 is a diagram of illustrative computer-aided design (CAD) tools that may be used in a logic design system in accordance with an embodiment of the present invention.

Illustrative computer aided design tools 62 that may be used in a logic design system such as system 56 of FIGS. 2 and 3 are shown in FIG. 4.

The design process typically starts with the formulation of logic circuit functional specifications. A logic designer can specify how a desired circuit should function using design and constraint entry tools 64. Design and constraint entry tools 64 may include tools such as design and constraint entry aid 66 and design editor 68. Design and constraint entry aids such as aid 66 may be used to help a logic designer locate a desired design from a library of existing logic designs and may provide computer-aided assistance to the logic designer for entering (specifying) the desired design. As an example, design and constraint entry aid 66 may be used to present screens of options for a user. The user may click on on-screen options to select whether the circuit being designed should have certain features. Design editor 68 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 64 may be used to allow a logic designer to provide a desired logic design using any suitable format. For example, design and constraint entry tools 64 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 64 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 64 may allow the logic designer to provide a logic design to the logic design system 10 using a hardware description language such as Verilog hardware description language (HDL) or Very High Speed Integrated Circuit Hardware Description Language (VHDL). The designer of the logic circuit can enter the logic design by writing hardware description language code with editor 68. Blocks of code may be imported from user-maintained or commercial libraries if desired.

After the design has been entered using design and constraint entry tools 64, behavioral simulation tools 72 may be used to simulate the functional performance of the design. If the functional performance of the design is incomplete or incorrect, the logic designer can make changes to the design using design and constraint entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.).

Once the functional operation of the logic design has been determined to be satisfactory, logic synthesis and optimization tools 74 may be used to implement the logic design in a particular programmable logic device (i.e., in the logic and interconnect resources of a particular programmable logic device product or product family).

Tools 74 attempt to optimize the design by making appropriate selections of hardware to implement different logic functions in the logic design based on the logic design data and constraint data entered by the logic designer using tools 64. Tools 74 may also be used in determining optimum voltage levels for power supply and body bias voltages.

After logic synthesis and optimization using tools 74, the logic design system may use tools such as placement and routing tools 76 to perform physical design steps (layout synthesis operations). Placement and routing tools 76 are used to determine how to place the circuits for each logic function within the programmable logic device. For example, if two counters interact with each other, the placement and routing tools 76 may locate these counters in adjacent logic regions on the programmable logic device to minimize interconnect delays. The placement and routing tools 76 create orderly and efficient implementations of logic designs for a given programmable logic device.

Tools such as tools 74 and 76 may be part of a compiler suite (e.g., part of a suite of compiler tools provided by a programmable logic device vendor). In accordance with the present invention, tools such as tools 74 and 76 manually and automatically take into account the effects of using different positive power supply voltages and different body bias voltages in implementing a desired circuit design in a programmable logic device. This allows tools 74 and 76 to minimize power consumption while satisfying design constraints.

After an implementation of the desired logic design in the programmable logic device has been generated using placement and routing tools 76, the implementation of the design may be analyzed and tested using analysis tools 78. After satisfactory optimization operations have been completed using tools 62, tools 62 can produce the configuration data for the programmable logic device or can generate other suitable output data (e.g., the specifications for a lithographic mask set for fabricating an integrated circuit incorporating the logic design). Depending on the type of programmable logic device being used (e.g., a device based on non-volatile memory, a device based on volatile memory, a device based on fuses or antifuses, etc.), configuration data may be programmed into the programmable logic device directly or may be provided to a configuration device that later (e.g., upon power-up) loads the configuration data into the programmable logic device to program the device.

Figure 5:
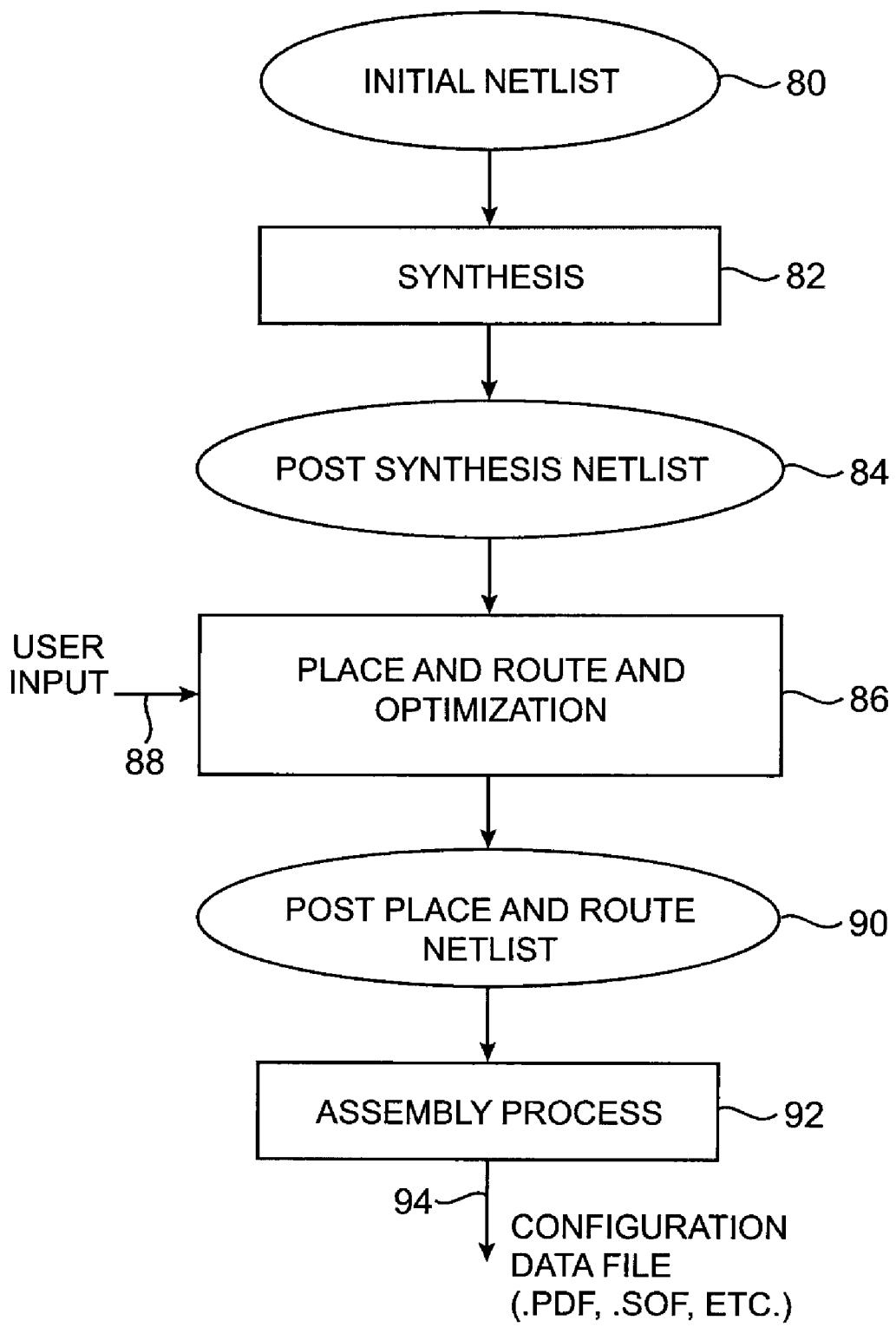
FIG. 5 is a flow chart of illustrative steps involved in designing a custom logic circuit and producing configuration data to be used when implementing the custom logic circuit in a programmable integrated circuit device in accordance with an embodiment of the present invention.

Illustrative operations involved in using tools 62 of FIG. 4 to produce configuration data files are shown in FIG. 5. As shown in FIG. 5, an initial netlist 80 is synthesized at step 82 to produce a post-synthesis netlist 84. At step 86, user input 88 and the post synthesis netlist 84 are processed during place and route and optimization operations. During the operations of step 86, the CAD tools 62 take account of the effects of using different positive power supply voltages and/or body bias voltages and, through appropriate selection of power supply and body bias levels, circuit resource assignments, and placement decisions, tools 62 reduce power consumption while satisfying design constraints. The resulting netlist 90 is processed further during an assembly process 92 to produce a configuration data file output 94 (e.g., a .pof or .sof file).

For each circuit block, CAD tools 62 can automatically identify appropriate power supply levels (e.g., one or more minimum acceptable positive power supply levels, body bias voltages, etc.) that allow the logic designer's circuit to function as desired, while minimizing power consumption for device 10. If desired, manual voltage supply selections for portions of the user's design or for particular circuit blocks may be supplied by the logic designer.

Figure 6:
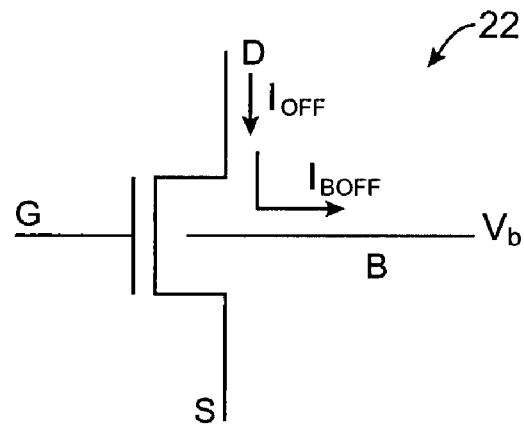
FIG. 6 is a schematic diagram of a body biased n-channel metal-oxide-semiconductor transistor in accordance with and embodiment of the present invention.

Transistor leakage currents can be a significant contributor to unwanted power dissipation on an integrated circuit. A schematic diagram of an illustrative n-channel metal-oxide-semiconductor transistor 22 is shown in FIG. 6. Leakage currents that may be present in transistor 22 include transistor leakage current Ioff and transistor body leakage current Iboff. The source of transistor 22 is labeled S, the drain is labeled D, the gate is labeled G, and the body is labeled B. Leakage current Iboff may be measured when gate G and source S are grounded at Vss (e.g., 0 volts), terminal D is at 1.1 volts (or other suitable positive power supply voltage) and body bias voltage Vb is being applied to body terminal B. It is generally desirable to minimize Ioff and Iboff whenever possible, to minimize power consumption.

Figure 7:
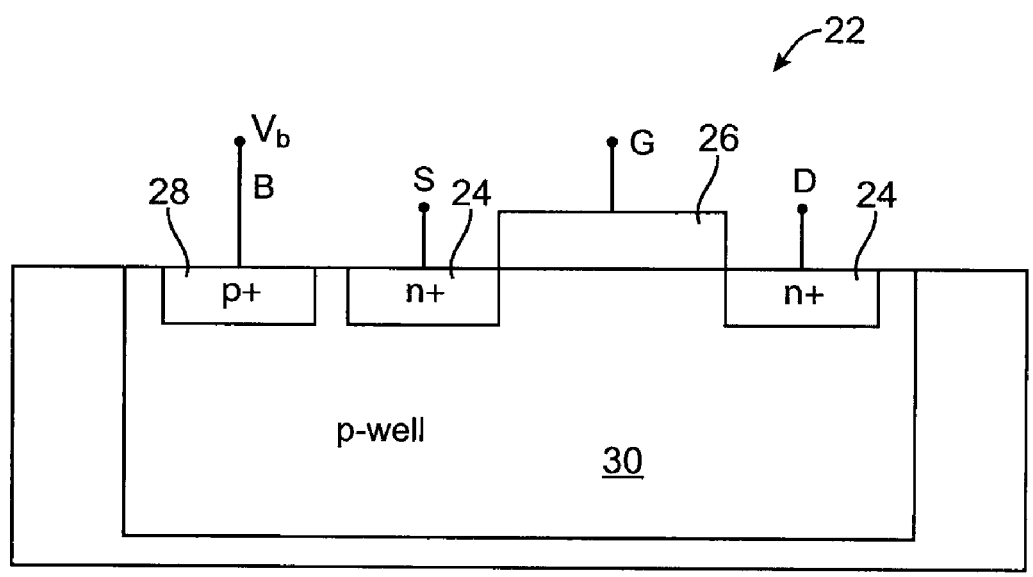
FIG. 7 is a cross-sectional view of a body biased n-channel metal-oxide-semiconductor transistor in accordance with and embodiment of the present invention.

A cross-sectional diagram of the n-channel transistor 22 of FIG. 6 is shown in FIG. 7. Source S and drain D are formed using implant regions 24. Gate structure 26 is formed from a thin layer of insulator such as silicon oxide and a gate conductor such as silicided polysilicon. Body terminal B uses implant region 28 to form an ohmic contact with p-type body region 30.

Although the transistor shown in the example of FIGS. 6 and 7 is an n-channel metal-oxide-semiconductor transistor, device 10 may also contain p-channel metal-oxide-semiconductor transistors. Adjustable voltage supplies may be used to adjust the positive power supply voltage and the body bias voltage for both n-channel and p-channel devices.

There is a tradeoff between power consumption (i.e., leakage current Iboff) and body bias voltage. There is also a tradeoff between body bias voltage and transistor performance. The amount of time that a transistor takes to switch a digital signal is sometimes referred to as its gate delay. Transistors with small gate delays switch rapidly. Transistors with large gate delays switch slowly.

Figure 8:
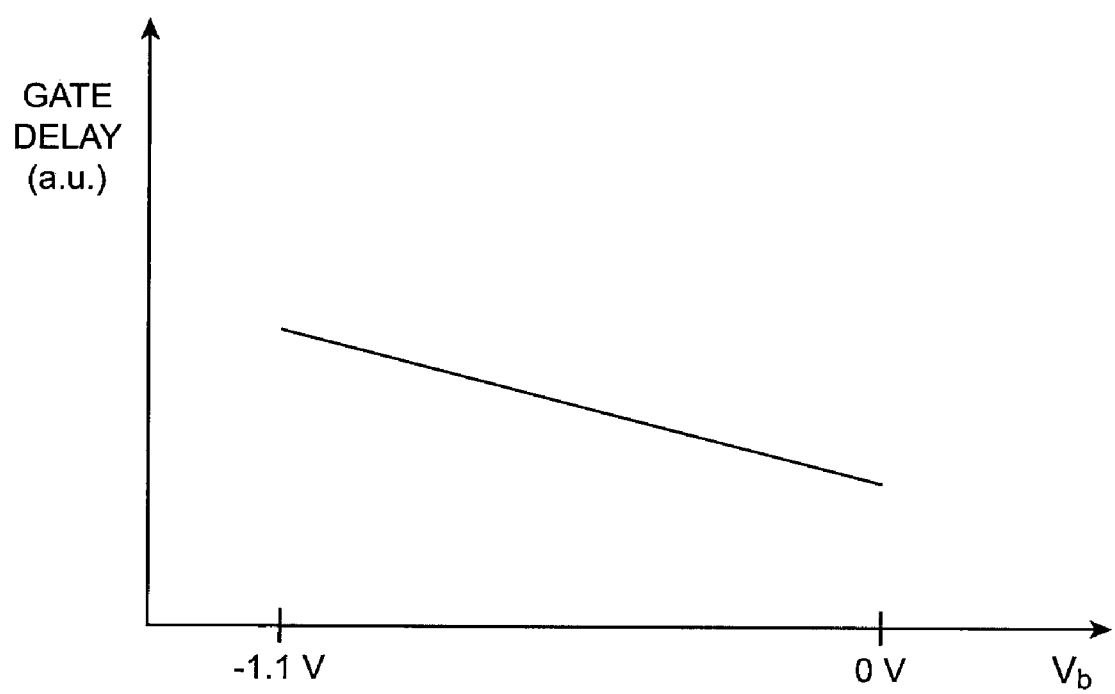
FIG. 8 is a graph in which gate delay is plotted as a function of transistor body bias voltage in accordance with an embodiment of the present invention.

As shown in FIG. 8, the gate delay of the transistors on device 10 increases as the magnitude of body bias voltage Vb increases. Gate delays are minimized when there is no body bias voltage (i.e., when Vb is 0 volts.). In this situation, performance is maximized, at the expense of increased leakage current. At non-zero body bias voltages (e.g., Vb=−1.0 volts for an n-channel transistor), transistor threshold voltage is increased and leakage currents are reduced.

There is a speed reduction for transistors that are body biased to reduce leakage current in this way, but for non-critical circuit blocks, the benefits of reduced power consumption outweigh the drawbacks of slower switching speed. In some situations, body bias voltages with even larger magnitudes (e.g., −1.1 volts or −1.2 volts or more for n-channel devices) may be used. The curve of FIG. 8 shows the tradeoff between increased body bias magnitude and increased gate delay. Data for this type of curve may be stored in databases 63 and used by CAD tools 62 in determining an appropriate level of body bias voltage Vb to use for each circuit block.

Figure 9:
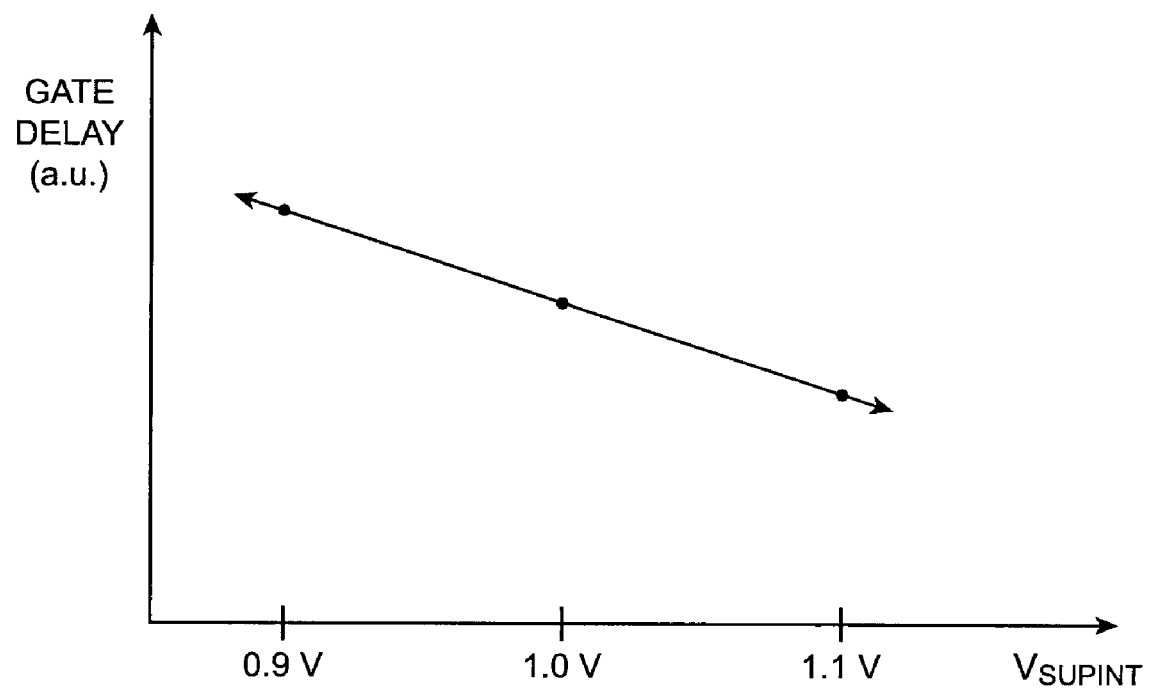
FIG. 9 is a graph in which gate delay is plotted as a function of transistor power supply voltage in accordance with an embodiment of the present invention.

There is also a tradeoff between power consumption (leakage current) and the positive power supply voltage that is used to power the circuit blocks on device 10. As shown in FIG. 9, the shortest gate delays are obtained when a circuit block is powered at a relatively large positive power supply voltage Vsupint (e.g., 1.1 volts). At lower power supply voltages Vsupint, the gate delays of the transistors rise. When it is desired to maximize performance for a circuit block to ensure that timing constraints or other design constraints are satisfied, a relatively large power supply voltage such as 1.1 volts may be applied to the circuit block. When it is not necessary to use such a large voltage (e.g., when timing is less critical), a lower power supply voltage may be used (e.g., 0.9 volts or 1.0 volts). The lower power supply voltage will tend to slow down the circuit block, but will also reduce undesired power consumption. Information on the curve of FIG. 9 may be stored in databases 63 for CAD tools 62. When implementing a user's design, CAD tools 62 can analyze device 10 to determine which circuit blocks require full power supply voltages to satisfy their design constraints and which circuit blocks will operate properly with lower power supply voltages. Configuration data that embodies these power supply settings may then be generated by the CAD tools 62 and loaded into device 10 during programming.

Figure 10:
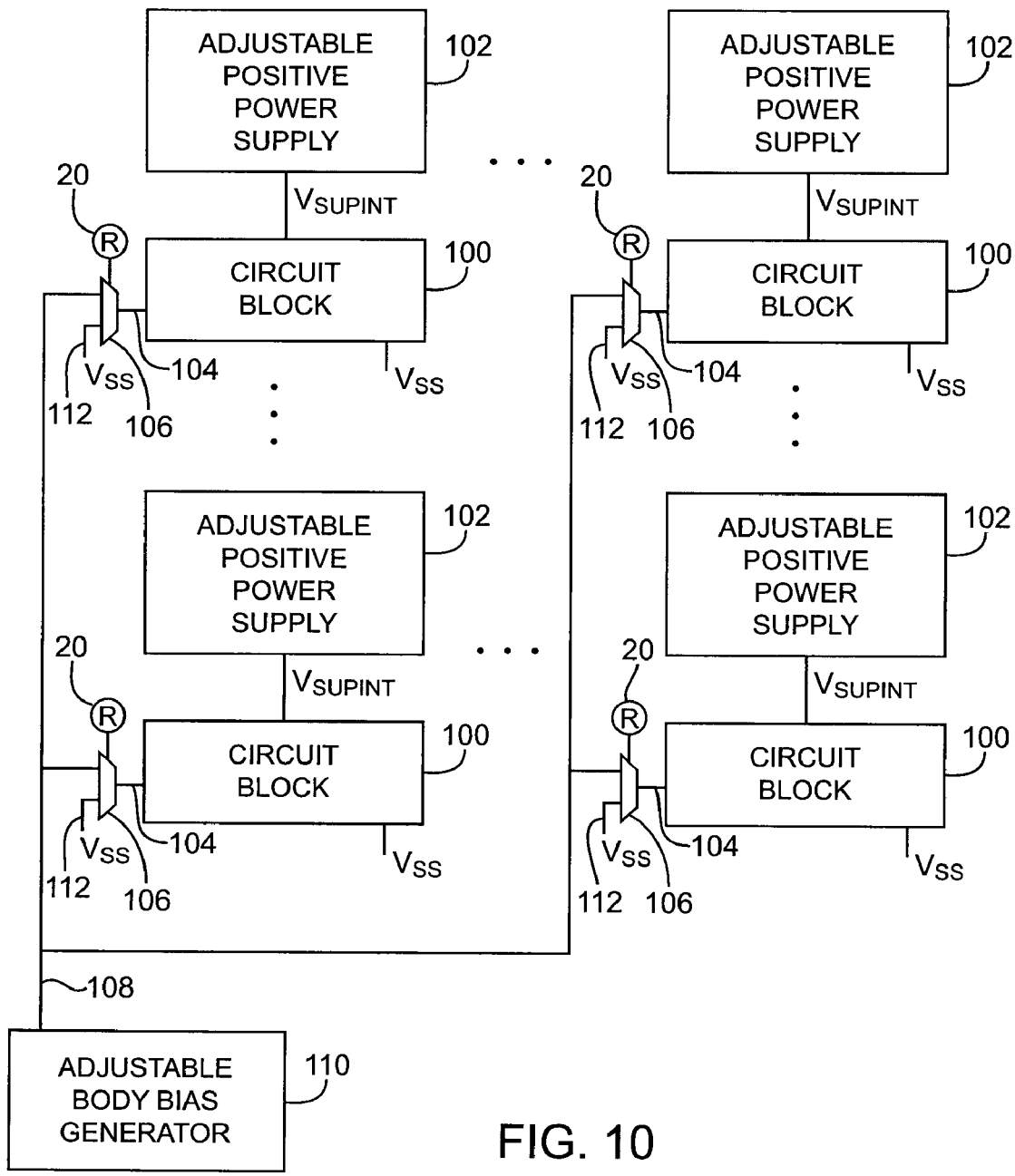
FIG. 10 is a schematic diagram of an illustrative integrated circuit in which adjustable body bias circuitry and independently adjustable positive power supply voltage circuits are used to supply various circuit blocks with customized body bias and power supply voltages in accordance with an embodiment of the present invention.

FIG. 10 shows a circuit diagram for an illustrative portion of a programmable integrated circuit such as programmable logic device 10. As shown in FIG. 10, device 10 may have multiple circuit blocks 100. Circuit blocks 100 may be, for example, blocks of programmable logic, memory blocks, blocks of processing circuitry (e.g., digital signal processing circuitry, multipliers, etc.), or any other suitable circuit blocks. Depending on a user's particular logic design, some or all of blocks 100 may be used. Among the blocks 100 that are used, some will have higher speed requirements and some will have lower speed requirements. Adjustable power supply circuits 102 may be used to provide blocks 100 with positive power supply voltage Vsupint. Circuits 102 are preferably independently adjustable, so the value of Vsupint may be different for different blocks 100, depending on the timing requirements for each block. Circuit blocks 100 that must switch rapidly may be provided with higher Vsupint values to reduce their gate delays, as shown in FIG. 9. Circuit blocks that have less stringent timing requirements may be provided with lower Vsupint values to reduce power consumption.

The settings of adjustable positive power supplies 102 may be adjusted by loading configuration data into associated programmable elements 20. As shown in FIG. 10, there may be an independently adjustable positive power supply 102 associated with each circuit block. If desired, other configurations may be used. For example, there may be one adjustable positive power supply 102 for each pair of circuit blocks 100, for each group of three or four circuit blocks 100, or for larger portions of the circuitry on device 10.

Each circuit block 100 may be powered using a ground voltage Vss (e.g., 0 volts). Adjustable power supply circuitry may be used to adjust Vss on a block-by-block basis or with any other suitable level of granularity. In a typical arrangement, a single unvarying power supply voltage Vss may be provided to all circuit blocks 100 in parallel.

The adjustable power supply circuitry of FIG. 10 may be used to provide circuit blocks 100 with adjustable levels of body bias Vb. Adjustable body bias generator 110 may be used to generate a body bias voltage. Multiplexers 106 may be used to apply the body bias voltage from adjustable body bias generator circuitry 110 or a ground voltage to respective circuit blocks 100. Multiplexers 106, which are shown as being separate from adjustable body bias generator 110 in FIG. 10, are sometimes considered to be part of adjustable body bias generator circuitry 110.

The states of multiplexers 106 may be adjusted by associated memory elements 20. When it is desired to operate the transistors in a given circuit block at their maximum speed, the multiplexer 106 that is associated with that block may be adjusted so that a respective ground terminal 112 is connected to the body terminals within the block. Hardwiring the body terminals of the transistors to ground in this way ensures that the transistors within the block will switch at full speed. When it is acceptable to operate the transistors in a block 100 at less than maximum speed while still satisfying the user's design constraints, the multiplexer 106 may connect output 108 of adjustable body bias generator 110 to terminal 104, thereby routing the body bias voltage from adjustable body bias generator 110 to the body terminals of the transistors in the block.

When a circuit block is not being used to implement a user's logic design, the positive power supply Vsupint and the body terminals of the transistors in the block can be grounded to power down the block. In some configurations, the power supply voltage Vsupint may still be present in unused blocks. Unused blocks of this type can be placed in a low-leakage powered down state by providing the body terminals within the block with a suitable reverse bias voltage level (e.g., a maximum reverse bias level of −1.0 volts for the p+ body terminal in an NMOS device or +2.1 volts for the n+ body terminal in a PMOS device).

If desired, multiple body bias generators 110 may be provided on a given device (e.g., a single body bias generator for each circuit block 100). In general, however, it consumes less circuit real estate to provide device 10 with a single adjustable body bias generator for n-channel devices (and, if desired, a single adjustable body bias generator for p-channel devices). Body bias generator 110 may be implemented using a charge pump circuit that generates the desired body bias voltage. For example, body bias generator 110 may use a charge pump circuit to generate a negative body bias voltage from a positive power supply voltage and ground. The operation of charge pump circuitry tends to be influenced by parasitics, so it may be difficult to distribute the circuitry of a charge pump across device 10 effectively. Accordingly, it may be desirable to implement adjustable body bias generator 110 using circuitry in a single location on device 10.

Figure 11:
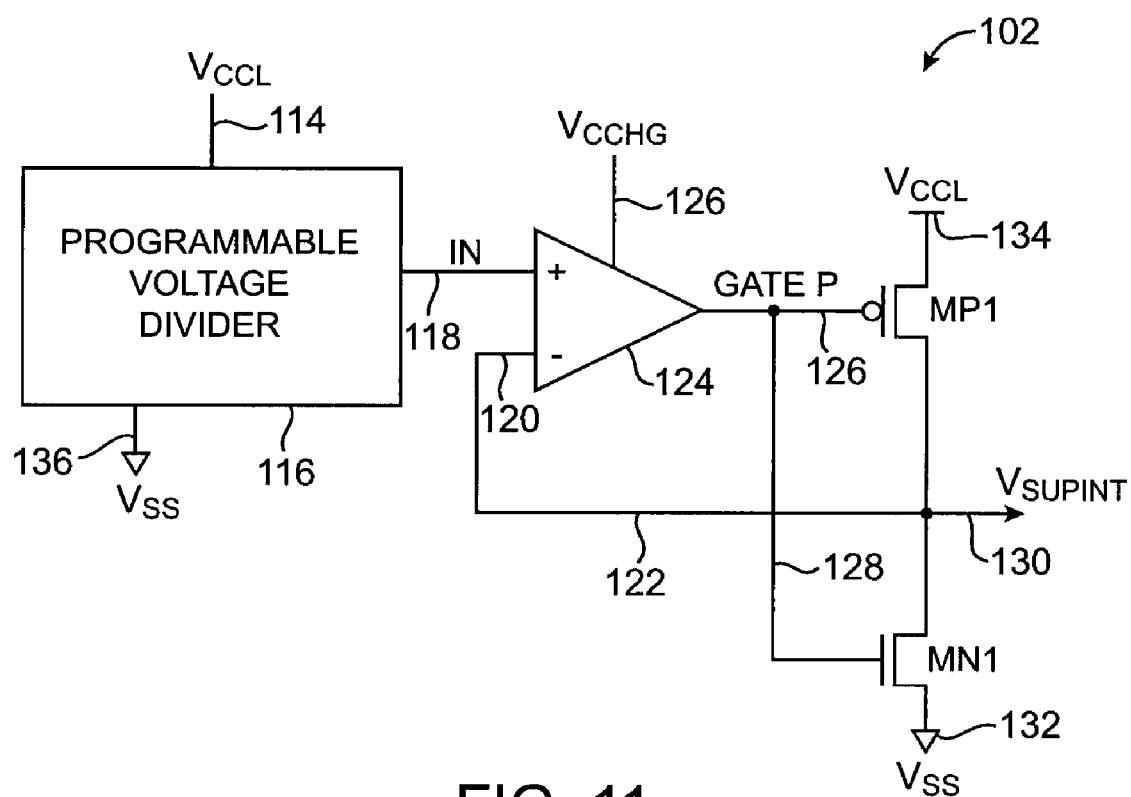
FIG. 11 is a schematic diagram of an illustrative adjustable positive power supply voltage regulator circuit in accordance with an embodiment of the present invention.

An illustrative adjustable positive power supply 102 is shown in FIG. 11. Power supply 102 may be powered using positive voltages Vccl and Vcchg and ground voltage Vss. Any suitable voltage levels may be used. The voltage Vcchg is preferably larger than the voltage Vccl. With one suitable arrangement, Vccl is 1.1 volts and Vcchg is 1.6 volts. Voltage Vccl may be provided to terminals 114 and 134. Ground voltage Vss may be provided to terminals 132 and 136. Voltage Vcchg may be provided to terminal 126.

Programmable voltage divider 116 receives voltages Vccl and Vss and provides a voltage IN on line 118 that ranges from Vss to Vccl. Operational amplifier 124 receives signal IN at its positive input. Feedback path 122 is connected to negative input 120 of operational amplifier 124 in a unity gain configuration. Operational amplifier 124 compares the signals on inputs 118 and 120 and produces a corresponding control signal output GATEP on line 126. The signal GATEP is used to control the gate of p-channel metal-oxide-semiconductor transistor MP1 and the gate of n-channel metal-oxide-semiconductor transistor MN1. When GATEP is high, MP1 is off, MN1 is on, and Vsupint is at Vss. When GATEP is low, transistor MP1 is on, transistor MN1 is off, and Vsupint is at Vccl. Vsupint may be set to intermediate voltages between Vss and Vccl by proper adjustment of programmable voltage divider 116.

Figure 12:
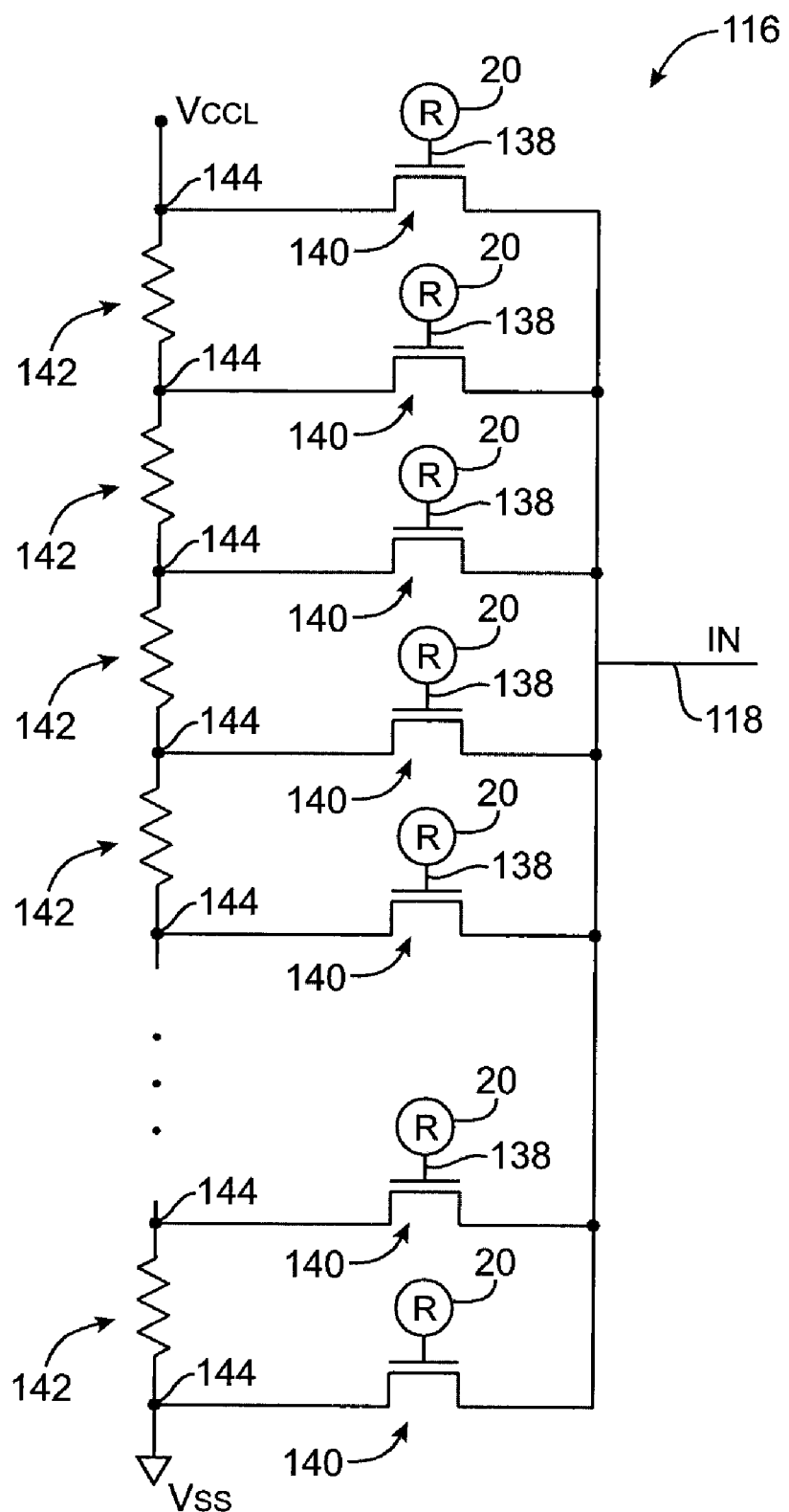
FIG. 12 is an is a schematic diagram of an illustrative programmable voltage divider that may be used in a programmable circuit such as an adjustable positive power supply voltage regulator circuit or body bias circuit in accordance with an embodiment of the present invention.

An illustrative programmable voltage divider 116 is shown in FIG. 12. Voltage divider 116 has a number of resistors 142 that are connected in series between positive voltage Vccl and ground terminal Vss. The resistors may all have the same value or may have different values. Transistors 140 are used to tap into the series-connected chain of resistors at nodes 144. Control signals are applied to the gates of transistors 140 via control lines 138. The control signals may be used to turn all but one of the transistors off. The transistor 140 that is turned on taps into the chain of resistors 142 at a desired node 144. Each node 144 has a different voltage ranging from Vss to Vccl. By selecting the tap point in the resistor chain, the output voltage IN on line 118 may be adjusted.

Figure 13:
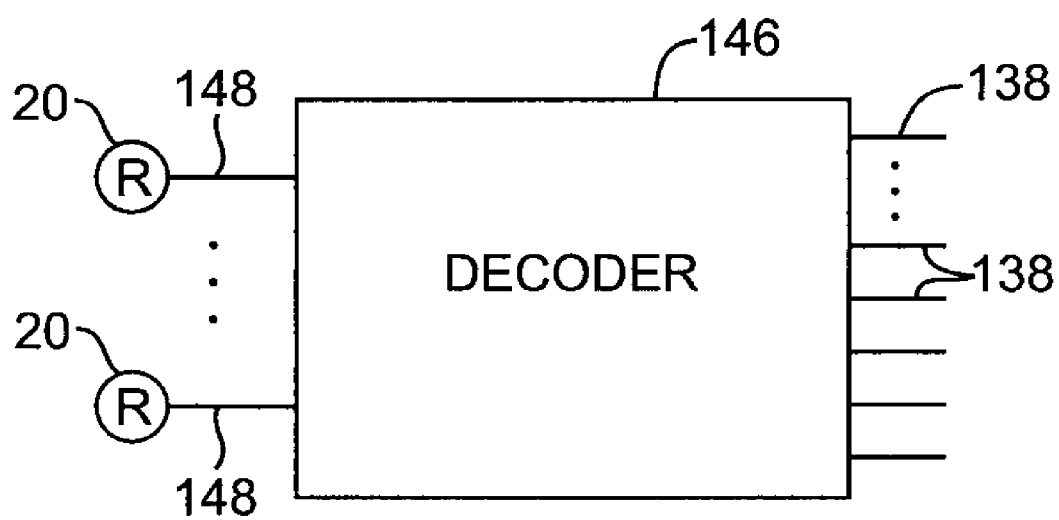
FIG. 13 is a schematic diagram of an illustrative decoder that may be used to decode control signals that are to be applied to a programmable component such as a programmable voltage divider in accordance with an embodiment of the present invention.

In the illustrative arrangement of FIG. 12, individual memory elements 20 are shown as being used to provide the control signals to transistors 140. If desired, a decoder such as decoder 146 of FIG. 13 may be used to apply control signals to lines 138. The control signals on lines 138 may be generated by decoder 146 based on a set of undecoded control signals that are applied to inputs 148 of decoder 146 from respective memory element 20 that have been loaded with configuration data.

Because of the unity gain configuration of the operational amplifier circuit of FIG. 11, the positive power supply voltage Vsupint that is provided at output line 130 tracks the voltage IN on line 118, as shown in the table of FIG. 14. If, for example, IN is 0 volts, Vsupint will be 0 volts. If IN is Vccl, Vsupint will be Vccl. If the value of IN lies between 0 and Vccl (i.e., at a voltage V1 that is established by the setting of voltage divider 116), the value of Vsupint will be equal to V1.

When maximum performance is desired, the value of Vsupint for a given circuit block 100 may be set to Vccl. When the resources of a circuit block 100 are not being used to implement a user's desired custom circuit design, the voltage Vsupint for that block may be set to Vss to turn off the block. Other blocks of circuitry may be needed to implement part of the user's circuit design, but need not operate at their highest possible speed. These noncritical circuit blocks may be provided with an intermediate level of Vsupint.

Figure 15:
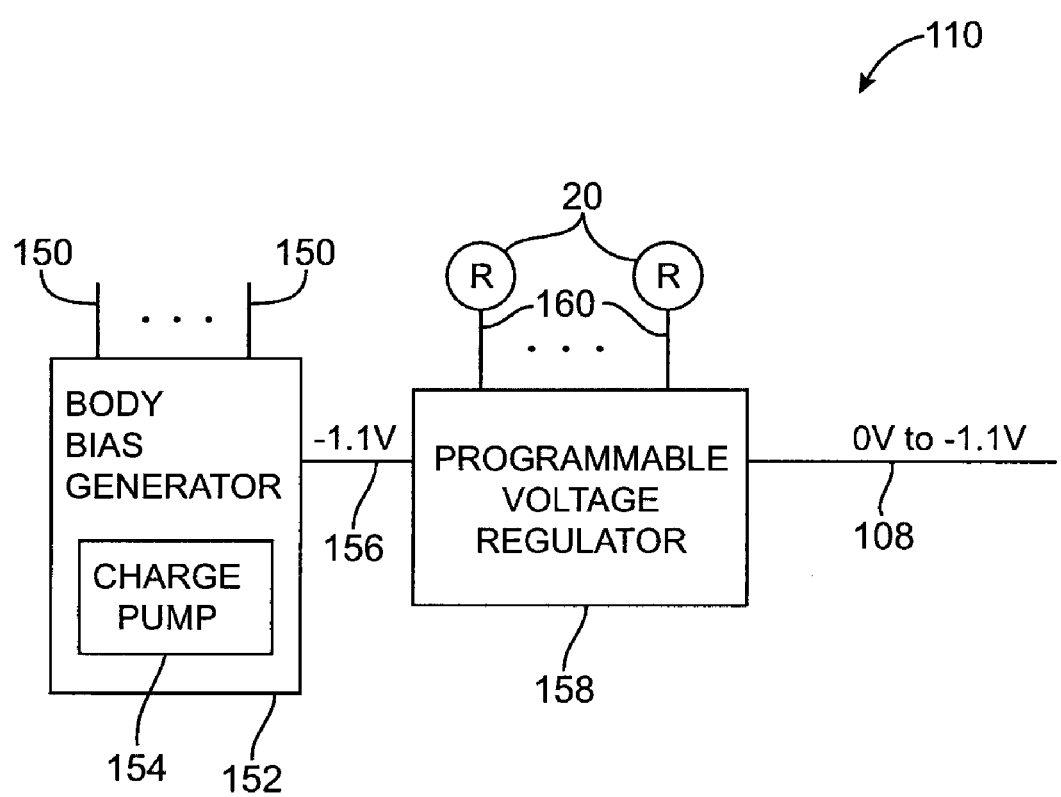
FIG. 15 is an illustrative schematic circuit diagram of an illustrative programmable body bias circuit that may be used in a programmable integrated circuit in accordance with the present invention.

FIG. 15 shows an illustrative circuit that may be used for adjustable body bias generator 110 of FIG. 10. Adjustable body bias generator 110 may have a body bias generator circuit 152 that is based on a charge pump 154. Generator circuit 152 may generate an output voltage (e.g., a negative output voltage of −1.1 volts in the example of FIG. 15) on output line 156 based on power supply signals received on lines 150. Lines 150 may, if desired, be coupled to pins such as pins 14 to receive external power supply signals (e.g., Vss and Vccl or Vcchg).

Programmable voltage regulator 158 may be adjusted by control signals provided on lines 160. Lines 160 may receive control signals from associated memory elements 20 or a decoder of the type shown in FIG. 13. The programmable voltage regulator may contain an operational amplifier and programmable voltage divider as described in connection with FIGS. 11 and 12. The programmable voltage regulator receives the output voltage from body bias generator 152 on line 156 and provides a corresponding regulated body bias voltage on line 108. In the example of FIG. 15, the output voltage on line 108 may range from 0 to −1.1 volts. This is, however, merely illustrative.

Figure 16:
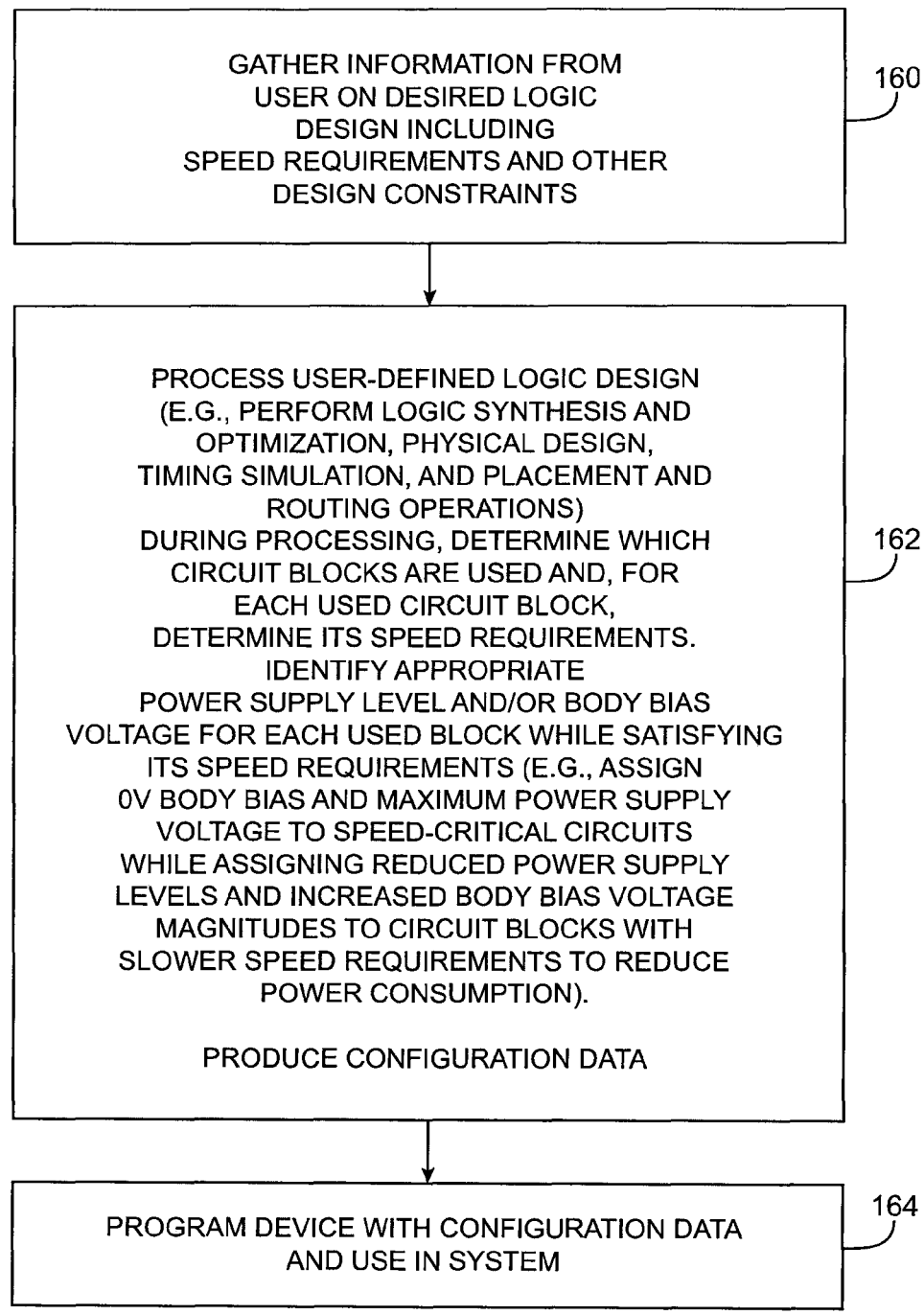
FIG. 16 is a flow chart of illustrative steps involved in using a logic design tool to optimize device performance by making appropriate positive power supply and transistor body bias selections for circuit blocks on an integrated circuit in accordance with an embodiment of the present invention.

Illustrative steps involved in using CAD tools 62 to minimize power consumption in device 10 when implementing a custom logic design in device 10 are shown in FIG. 16.

At step 160, tools such as design and constraint entry tools 64 use input screens to obtain the desired custom logic design from the logic designer. The design includes design constraints such as timing constraints, signal strength constraints, logic function constraints, etc. A settings screen and/or other suitable user input arrangements (e.g., voice command input arrangements and batch processing mode input arrangements) are used to gather user settings related to identifying one or more appropriate power supply levels. If desired, some or all settings may be provided as defaults.

During step 160, the user can specify constraints such as gate delay or switching speed, desired power supply levels, current levels, etc. For example, a user may specify a desire that a particular circuit block operate at a particular minimum speed or maximum delay. This can be done on an circuit-block-by-circuit-block basis, on a group of circuit blocks, or on an entire chip. If desired, settings such as these may be provided as defaults (e.g., when a user does not specify any such constraints).

At step 162, logic synthesis and optimization, physical design, and timing simulation operations may be performed using tools 72, 74, 76, and 78 of FIG. 4. During these operations, the CAD tools 62 process the design constraints obtained at step 160 and produce a design implementation for the programmable logic device integrated circuit. In particular, based on a user-supplied logic design and constraints, the CAD tools identify circuit block power supply levels (Vsupint values) and/or body bias levels (Vb values) to be used in powering the device when the device is used in a system of the type described in connection with FIG. 2.

As described in connection with the performance curves of FIGS. 8 and 9, changes in Vb and Vsupint affect the switching speed and leakage current of circuit blocks 100. If a given circuit block is required to operate at its maximum speed, the body bias Vb may be hardwired to ground and the positive power supply voltage Vsupint may be set to its maximum value (e.g., 1.1 volts). This ensures that the circuit block will switch rapidly at the expense of maximized leakage current. If a given circuit block need not switch at its most rapid possible speed, the adjustable body bias circuit may be used to apply a desired value of body bias voltage Vb to the body terminal of the transistors in the block and/or the adjustable positive power supply voltage may be used to apply a desired value of positive power supply voltage Vsupint to the power terminals of the block (e.g., to the source-drain terminals of inverter circuits in the block, etc.). These Vsupint and Vb values can be used to minimize leakage current and thereby reduce power consumption, while still satisfying design constraints such as timing constraints.

The CAD tools may identify any suitable number of positive power supply voltages and body bias voltages. In a typical scenario, circuitry of the type shown in FIG. 10 is used to distribute the power supply and body bias voltages. Using an arrangement of the type shown in FIG. 10, all critical circuit blocks may be supplied with a body bias of 0 volts by hardwiring the body bias terminals of the critical circuit blocks to ground through respective multiplexers 106. The adjustable positive power supply voltages Vsupint that are supplied to those blocks may be, for example, the maximum core logic power supply voltage used on device 10 (e.g., 1.1 volts). All the noncritical blocks that are being used may receive a non-zero body bias voltage Vb from adjustable body bias generator 110. Individually established values of Vsupint may be applied to each noncritical block. These values of Vsupint may be selected to be sufficiently high to ensure that timing constraints are satisfied while being sufficiently low to help reduce leakage current and power consumption.

After the CAD tools have allocated resources and performed placement operations that ensure that the implementation of the desired custom logic circuit satisfies design constraints, the CAD tools produce corresponding configuration data for programming the programmable logic device.

During step 162, the CAD tools balance performance criteria against power consumption criteria. In resolving conflicts between various design constraints, the tools 62 can make tradeoffs (e.g., performance versus power consumption). Tradeoffs can be made based on criteria provided by the logic designer and can be made based on predefined criteria (e.g., criteria built into tools 62). Data such as the information on gate delays as a function of power supply voltage and body bias voltage of FIGS. 8 and 9 may be used by tools 62.

After the desired logic design has been satisfactorily optimized at step 162, the tools 62 of the logic design system 56 can produce configuration data for programming the programmable logic device 10 or other suitable programmable integrated circuit. The programmable logic device can be provided with the configuration data and used in a system of the type described in FIG. 2 at step 164. The configuration data configures the programmable logic device to perform the desired custom logic function of the logic designer. Because tools 62 were used in producing the implementation of the desired design, the configuration data will configure the logic device and the settings of the adjustable body bias generator 110, multiplexers 106, and adjustable power supplies 102 so that the design constraints are satisfied and that overall power consumption is minimized.

The foregoing is merely illustrative of the principles of this invention and various modifications can be made by those skilled in the art without departing from the scope and spirit of the invention.

What is claimed is:

1. An integrated circuit comprising:
    a plurality of circuit blocks comprising programmable logic with metal-oxide-semiconductor transistors having body terminals;
    adjustable body bias circuitry that applies a body bias voltage to the body terminals of the transistors in at least some of the circuit blocks;
    a plurality of independently adjustable power supplies, each independently adjustable power supply applying a respective power supply voltage to a respective one of the plurality of circuit blocks; and
    programmable elements in the programmable logic that are loaded with configuration data that configure the programmable logic to implement a user's circuit design, wherein at least some of the circuit blocks are unused in implementing the user's circuit design and wherein the adjustable body bias circuitry applies a power-down voltage to the body terminals of the unused circuit blocks to power down the unused circuit blocks.

2. The integrated circuit defined in claim 1 wherein the power-down voltage comprises a ground voltage, wherein the adjustable body bias circuitry applies the ground voltage to the body terminals of the unused circuit blocks, and wherein one of the independently adjustable power supplies is associated with each of the unused circuit blocks and applies the ground voltage to that unused circuit block.

3. The integrated circuit defined in claim 1 wherein a first group of the circuit blocks contain transistors that are required to operate at a first speed to implement the user's circuit design and wherein a second group of the circuit blocks contain transistors that operate at a second speed when implementing the user's circuit design, wherein the second speed is slower than the first speed, and wherein the independently adjustable power supplies apply a first positive power supply voltage to the first group of circuit blocks and apply a second positive power supply voltage to the second group of circuit blocks, wherein the first power supply voltage is larger than the second power supply voltage.

4. The integrated circuit defined in claim 1 wherein a first group of the circuit blocks contain transistors that are required to operate at a first speed to implement the user's circuit design and wherein a second group of the circuit blocks contain transistors that operate at a second speed when implementing the user's circuit design, wherein the second speed is slower than the first speed, and wherein the adjustable body bias circuitry applies the ground voltage to the body terminals of the transistors in the first group of circuit blocks.

5. The integrated circuit defined in claim 1 wherein a first group of the circuit blocks contain transistors that are required to operate at a first speed to implement the user's circuit design and wherein a second group of the circuit blocks contain transistors that operate at a second speed when implementing the user's circuit design, wherein the second speed is slower than the first speed, and wherein the adjustable body bias circuitry applies the ground voltage to the body terminals of the transistors in the first group of circuit blocks and applies a nonzero body bias voltage to the body terminals of the transistors in the second group of circuit blocks.

6. The integrated circuit defined in claim 1 wherein the independently adjustable power supplies each comprise an operational amplifier in a unity gain configuration.

7. The integrated circuit defined in claim 1 wherein the independently adjustable power supplies each comprise a programmable voltage divider.

8. An integrated circuit comprising:
    a plurality of circuit blocks comprising programmable logic with metal-oxide-semiconductor transistors having body terminals;
    adjustable body bias circuitry that applies a body bias voltage to the body terminals of the transistors in at least some of the circuit blocks;
    a plurality of independently adjustable power supplies, each independently adjustable power supply applying a respective power supply voltage to a respective one of the plurality of circuit blocks; and
    programmable elements in the programmable logic that are loaded with configuration data that configure the programmable logic to implement a user's circuit design, wherein a first group of the circuit blocks contain transistors that are required to operate at a first speed to implement the user's circuit design and wherein a second group of the circuit blocks contain transistors that operate at a second speed when implementing the user's circuit design, wherein the second speed is slower than the first speed, wherein the adjustable body bias circuitry applies the ground voltage to the body terminals of the transistors in the first group of circuit blocks and applies a nonzero body bias voltage to the body terminals of the transistors in the second group of circuit blocks, wherein the independently adjustable power supplies each comprise a programmable voltage divider that is adjusted by static control signals from the programmable elements, and wherein the adjustable body bias circuitry comprises a charge pump.

9. The integrated circuit defined in claim 8 wherein at least some of the circuit blocks are unused in implementing the user's circuit design and wherein the adjustable body bias circuitry applies a ground voltage to the body terminals of the unused circuit blocks.

10. The integrated circuit defined in claim 8 wherein at least some of the circuit blocks are unused in implementing the user's circuit design, wherein the adjustable body bias circuitry applies a ground voltage to the body terminals of the unused circuit blocks, and wherein one of the independently adjustable power supplies is associated with each of the unused circuit blocks and applies the ground voltage to that unused circuit block.

11. Power supply circuitry on a programmable integrated circuit that has circuit blocks containing transistors with body terminals, wherein at least some of the circuit blocks are used to implement a given user's logic design and some of the circuit blocks are unused when implementing the given user's logic design, comprising:
    body bias generator circuitry that generates a nonzero body bias voltage that is applied to the body terminals of the transistors in a first group of the used circuit blocks and that applies a ground voltage to the body terminals of the transistors in a second group of the used circuit blocks, wherein the body bias generator circuitry applies a power-down voltage to the body terminals of the unused circuit blocks to power down the unused circuit blocks.

12. The power supply circuitry defined in claim 11 wherein the transistors have associated transistor switching speeds and transistor leakage currents, wherein the nonzero body bias voltage that is applied to the body terminals in the first group of circuit blocks reduces the transistor switching speeds and the transistor leakage currents in the first group of circuit blocks relative to the transistor switching speeds and the transistor leakage currents in the second group of circuit blocks.

13. The power supply circuitry defined in claim 11 further comprising:
a plurality of independently adjustable power supply circuits, each of which produces a power supply voltage for a respective one of the circuit blocks.

14. Power supply circuitry on a programmable integrated circuit that has circuit blocks containing transistors with body terminals, wherein at least some of the circuit blocks are used to implement a given user's logic design and some of the circuit blocks are unused when implementing the given user's logic design, comprising:
body bias generator circuitry that generates a nonzero body bias voltage that is applied to the body terminals of the transistors in a first group of the used circuit blocks and that applies a ground voltage to the body terminals of the transistors in a second group of the used circuit blocks; and
a plurality of independently adjustable power supply circuits, each of which produces a power supply voltage for a respective one of the circuit blocks, wherein a first group of the independently adjustable power supply circuits produces a first positive power supply voltage to power some of the circuit blocks in the first group of circuit blocks and wherein a second group of the independently adjustable power supply circuits produces a second positive power supply voltage that is less than the first positive power supply voltage to power some of the circuit blocks in the first group of circuit blocks.

15. Power supply circuitry on a programmable integrated circuit that has circuit blocks containing transistors with body terminals, wherein at least some of the circuit blocks are used to implement a given user's logic design and some of the circuit blocks are unused when implementing the given user's logic design, comprising:
body bias generator circuitry that generates a nonzero body bias voltage that is applied to the body terminals of the transistors in a first group of the used circuit blocks and that applies a ground voltage to the body terminals of the transistors in a second group of the used circuit blocks; and
a plurality of independently adjustable power supply circuits, each of which produces a power supply voltage for a respective one of the circuit blocks, wherein a first group of the independently adjustable power supply circuits produces a first positive power supply voltage to power some of the circuit blocks in the second group of circuit blocks and wherein a second group of the independently adjustable power supply circuits produces a second positive power supply voltage that is less than the first positive power supply voltage to power some of the circuit blocks in the second group of circuit blocks.

16. Software on a computer-readable storage media comprising:
code for identifying first and second groups of circuit blocks on a programmable logic device integrated circuit that are used in implementing a given user's custom logic design, wherein the first group of circuit blocks contains transistors with body terminals to which a ground body bias voltage is applied and wherein the second group of circuit blocks contains transistors with body terminals to which a nonzero body bias voltage is applied; and
code for identifying a third group of circuit blocks on the programmable logic device integrated circuit that are unused in the given user's custom logic design, wherein the third group of circuit blocks contains transistors with positive power supply terminals to which a ground voltage is applied.

17. The software defined in claim 16 wherein at least some of the transistors in the first group of circuit blocks to which the ground body bias voltage is applied switch faster than at least some of the transistors in the second group of circuit blocks to which the nonzero body bias voltage is applied, the software further comprising:
code for identifying different positive power supply voltages to apply to the circuit blocks in the first group of circuit blocks based on design constraints supplied by the user to a logic design tool.

18. The software defined in claim 16 wherein at least some of the transistors in the first group of circuit blocks to which the ground body bias voltage is applied switch faster than at least some of the transistors in the second group of circuit blocks to which the nonzero body bias voltage is applied, the software further comprising:
code for identifying different positive power supply voltages to apply to the circuit blocks in the second group of circuit blocks based on design constraints supplied by the user to a logic design tool.

* * * * *